(12) United States Patent
Das

(10) Patent No.: US 12,463,652 B2
(45) Date of Patent: Nov. 4, 2025

(54) RESISTOR-BASED DIGITAL TO ANALOG CONVERTER

(71) Applicant: TEXAS INSTRUMENTS INCORPORATED, Dallas, TX (US)

(72) Inventor: Abhijit Kumar Das, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 140 days.

(21) Appl. No.: 17/894,019

(22) Filed: Aug. 23, 2022

(65) Prior Publication Data

US 2023/0103907 A1     Apr. 6, 2023

Related U.S. Application Data

(60) Provisional application No. 63/249,085, filed on Sep. 28, 2021.

(51) Int. Cl.
*H03M 1/06* (2006.01)

(52) U.S. Cl.
CPC .................................. *H03M 1/0617* (2013.01)

(58) Field of Classification Search
CPC ...... H03M 1/468; H03M 1/765; H03M 1/804; H03M 1/682; H03M 1/46; H03M 1/68; H03M 1/687; H03M 1/806; H03M 1/02; H03M 1/06; H03M 1/0617; H03M 1/0682; H03M 1/069; H03M 1/0863; H03M 1/0872; H03M 1/1014; H03M 1/1047; H03M 1/1061; H03M 1/144; H03M 1/145; H03M 1/168; H03M 1/365; H03M 1/38; H03M 1/466; H03M 1/664; H03M 1/74; H03M 1/802

USPC ................ 341/144, 150, 154, 155, 165, 172
See application file for complete search history.

(56) References Cited

U.S. PATENT DOCUMENTS

| | | | | |
|---|---|---|---|---|
| 4,200,863 | A * | 4/1980 | Hodges | H03M 1/38 |
| | | | | 341/172 |
| 7,439,896 | B2 * | 10/2008 | Sutardja | H03M 1/682 |
| | | | | 341/150 |
| 7,928,871 | B2 * | 4/2011 | Aruga | H03M 1/1047 |
| | | | | 341/172 |
| 8,395,538 | B2 * | 3/2013 | Das | H03M 1/68 |
| | | | | 341/172 |
| 8,396,538 | B2 | 3/2013 | Das et al. | |
| 11,563,440 | B2 * | 1/2023 | An | H03M 1/1014 |
| 2005/0206546 | A1 * | 9/2005 | Luo | H03M 1/682 |
| | | | | 341/155 |
| 2008/0158028 | A1 * | 7/2008 | Yang | H03M 1/109 |
| | | | | 341/118 |
| 2008/0191912 | A1 * | 8/2008 | Shin | H03M 1/667 |
| | | | | 341/122 |

(Continued)

*Primary Examiner* — Linh V Nguyen
(74) *Attorney, Agent, or Firm* — Xianghui Huang; Frank D. Cimino

(57) ABSTRACT

Examples of this description provide for a circuit. In some examples, the circuit includes a resistive network, a least significant bit (LSB) capacitor selectively coupled via a switch to receive an analog input voltage or to a selected first tap in the resistive network, and a charge boost network coupled in parallel with the resistive network and to a midpoint of the resistive network. To determine a most significant bit of lower order bits of a digital representation of the analog input voltage, the charge boost network is coupled to the LSB capacitor.

20 Claims, 4 Drawing Sheets

(56) References Cited

U.S. PATENT DOCUMENTS

| | | | | |
|---|---|---|---|---|
| 2008/0297390 A1* | 12/2008 | Ko | ............... | G09G 3/3685 |
| | | | | 341/144 |
| 2012/0319886 A1* | 12/2012 | Das | ............... | H03M 1/68 |
| | | | | 341/172 |
| 2013/0194115 A1* | 8/2013 | Wu | ............... | H03M 1/144 |
| | | | | 341/110 |
| 2014/0132435 A1* | 5/2014 | Dempsey | ............... | H03M 1/0872 |
| | | | | 341/154 |
| 2019/0237147 A1* | 8/2019 | Murakami | ............... | G11C 16/30 |
| 2019/0334543 A1* | 10/2019 | Luo | ............... | H03M 1/68 |

\* cited by examiner

RESISTOR-BASED DIGITAL TO ANALOG CONVERTER

CROSS-REFERENCE TO RELATED APPLICATIONS

The present application claims priority to U.S. Provisional Patent Application No. 63/249,085, which was filed Sep. 28, 2021, is titled "RESISTOR-BASED DIGITAL TO ANALOG CONVERTER," and is hereby incorporated herein by reference in its entirety.

BACKGROUND

An analog-to-digital converter (ADC) converts an analog input voltage to a digital representation in the form of bits. Some ADCs operate according to a successive approximation register (SAR) technique. SAR ADCs sequentially compare an analog input voltage to various reference voltage levels provided by a digital-to-analog converter (DAC) to provide a digital representation of the analog input voltage.

SUMMARY

In some examples, a circuit includes a resistive network, a least significant bit (LSB) switch, a LSB capacitor, and a charge boost network. The resistive network includes a first node configured to receive a first reference voltage, a second node configured to receive a second reference voltage, an output node, a set of resistors coupled in series between the first node the second node, wherein the set of resistors has a set of taps therebetween that includes a midpoint tap, and a first set of switches each coupled between a respective tap of the set of taps and the output node of the resistive network. The LSB capacitor is coupled the LSB switch. The LSB switch selectively couples the LSB capacitor to receive an analog input voltage or to the output node. The charge boost network is coupled in parallel with the resistive network to the first node and the second node and to the midpoint tap of the resistive network.

In some examples, a circuit includes a resistive network, a LSB capacitor selectively coupled via a switch to receive an analog input voltage or to a selected first tap in the resistive network, and a charge boost network coupled in parallel with the resistive network and to a midpoint of the resistive network. To determine a most significant bit of lower order bits of a digital representation of the analog input voltage, the charge boost network is coupled to the LSB capacitor.

In some examples, a method includes determining upper order bits of a digital representation of an analog input voltage, determining a most significant bit of lower order bits of the digital representation, and determining a remainder of the lower order bits of the digital representation. The most significant bit is determined by coupling a resistive network to a capacitor coupled to a comparator and coupling a charge boost capacitor to a midpoint of the resistive network.

DETAILED DESCRIPTION

In an example of a successive analog-to-digital conversion, during a first clock cycle of operation of a SAR ADC, a sampled input voltage is compared to half of a reference voltage output by a DAC. A bit decision relating to the most significant bit (MSB) of the digital representation is made based on whether the sampled input voltage is greater than half the reference voltage. During the next clock cycle, the input voltage is compared to three quarters or one quarter of the reference voltage in accordance with the preceding MSB decision, and a further bit decision is made relating to the next less significant bit (MSB−1) of the digital representation. The conversion procedure carries on accordingly, and the DAC output voltage converges successively to the analog input voltage, while evaluating one bit of the digital representation during each clock cycle until all bits of the digital representation have been evaluated.

Some SAR ADCs implement a charge redistribution technique which uses an array of capacitors. The charge stored on the capacitors is manipulated to perform the conversion from analog to digital. Some SAR ADCs also include a LSB capacitor that is coupled to a resistor network, sometimes referred to as a sub-ADC. Various tap points along the resistor network are coupled to the LSB capacitor to provide additional bit decisions.

Because SAR ADCs typically include capacitors and resistors, the voltages provided based on the reference voltage take a finite amount of time to settle before the comparison to make a bit decision can be made. In examples where the bit decision for the MSB involves a largest voltage step and largest impedance jump, the bit decision for the MSB may be more time consuming (e.g., resulting from an increase resistor-capacitor (RC) time constant), taking more time to settle to a correct voltage than for the determination of other bits of the digital representation.

Examples of this description include a circuit suitable for implementation as a sub-ADC of a SAR ADC, as described herein. The sub-ADC includes a resistor network, such as a resistor ladder, having a capacitor coupled to a tap of the resistor network. The coupling is, for example, implemented via one or more switches, such as transistor switches, to allow selective or programmable couplings. For example, a capacitor is coupled via a first switch between the midpoint of the resistor network and ground and via a second switch between a voltage reference and ground.

In some nomenclatures, the capacitor is referred to as a charge boost capacitor, while in others the capacitor is referred to as a dummy capacitor. In some examples, the addition of the capacitor decreases power consumption associated with settling of the voltage at the midpoint of the resistor ladder, such as for evaluating a bit decision relating to the digital representation, by approximately fifty percent.

Figure 1:
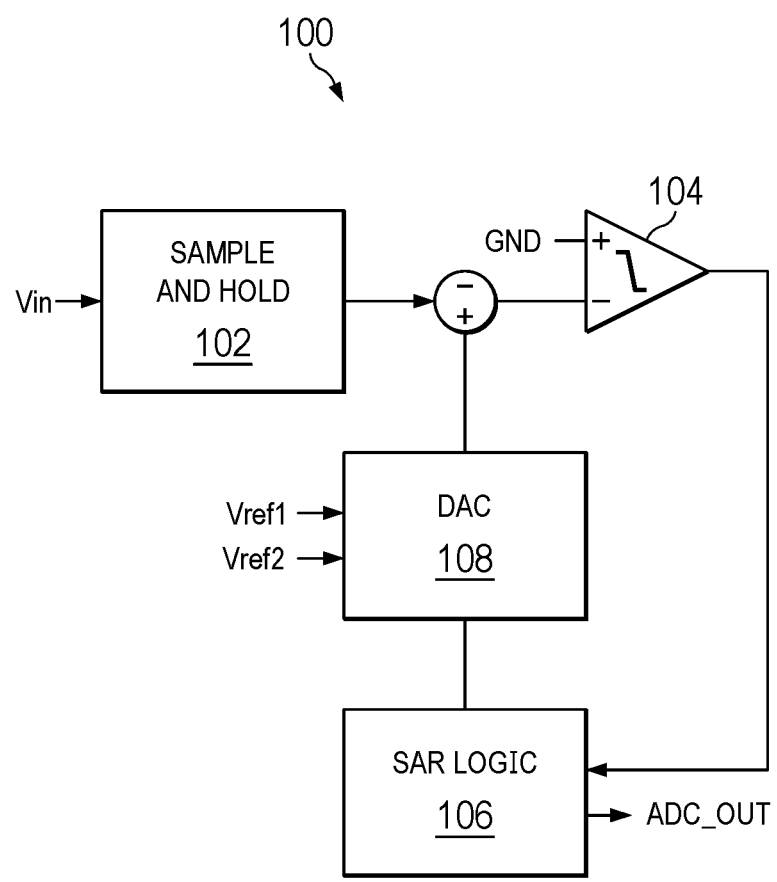
FIG. 1 is a block diagram of an ADC, in accordance with various examples.

FIG. 1 is a block diagram of an ADC 100, in accordance with various examples. The ADC 100 is representative of a SAR class of ADCs. The ADC 100 includes a sample and hold circuit 102, a comparator 104, SAR logic 106 (e.g., control logic), and a DAC 108. The analog input voltage (Vin) to be converted to a digital representation is provided as an input to the sample and hold circuit 102. An output of the sample and hold circuit 102 is summed with an output of the DAC 108 and provided to the comparator 104 at an inverting input of the comparator 104. The comparator 104 compares the received signal to a reference voltage, such as ground, received at a non-inverting input of the comparator 104. The DAC 108 is controlled by the SAR logic 106, as described below. The comparator 104 sequentially generates one output bit at a time during the conversion process and provides this bit to the SAR logic 106. Reference voltage Vref1 and Vref2 are provided to the DAC 108 such that Vin has a value between Vref1 and Vref2, inclusive. In some examples of operation of the ADC 100, Vref1 may have a non-zero value and Vref2 may be ground. In other examples of operation of the ADC 100, Vref1 and Vref2 may each have differing non-zero values. The SAR logic 106 receives and stores each bit decision provided by the comparator 104. Based on the received bit decisions, the SAR logic 106 controls the DAC 108 such that the digital representation is determined. After the SAR logic 106 has stored bit decisions for each bit of the digital representation, the SAR logic 106 may output the digital representation as a digital signal, or multiple digital signals that collectively form ADC_OUT.

Figure 2:
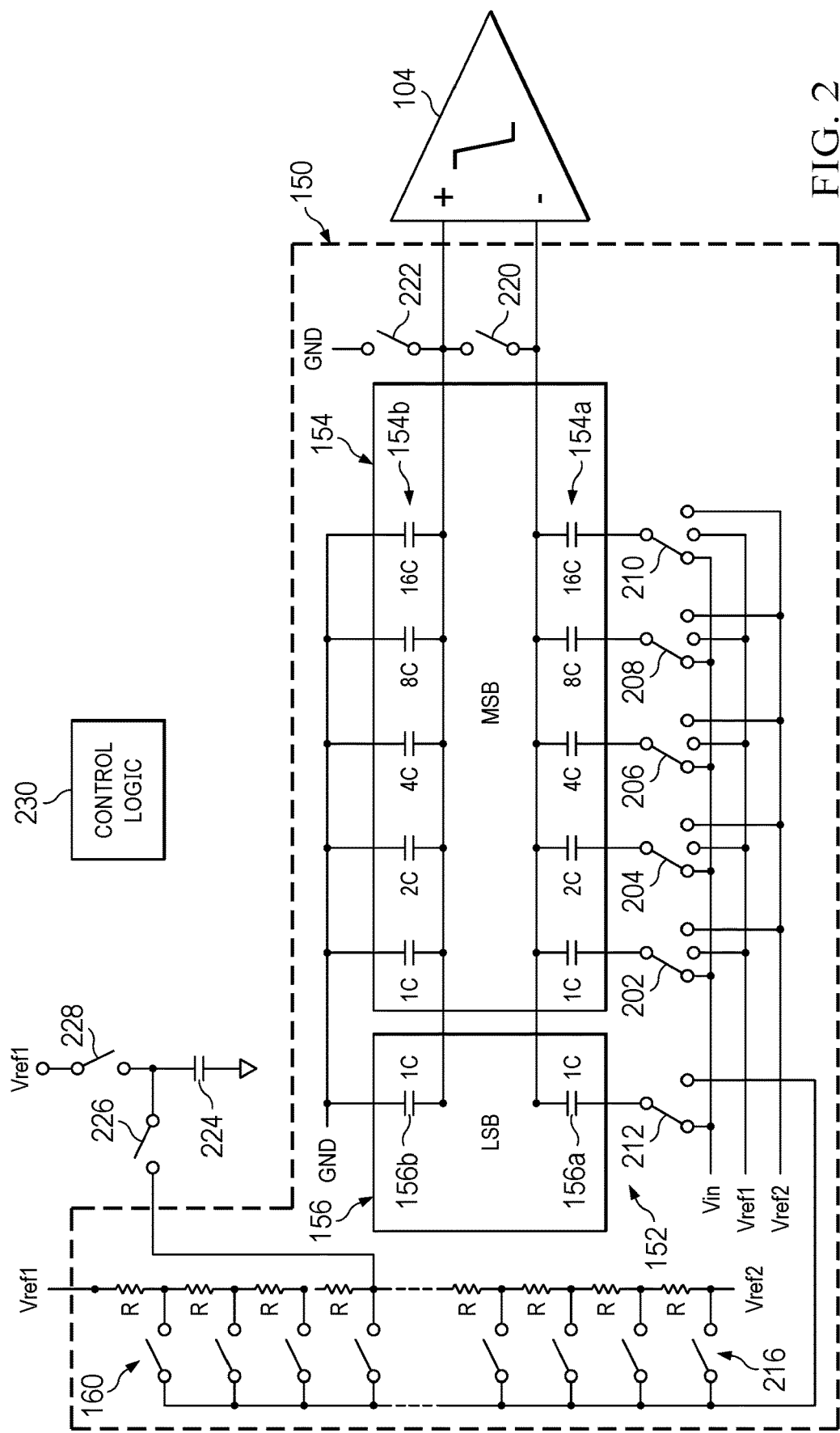
FIG. 2 is a schematic diagram of a DAC, in accordance with various examples.

In a 12-bit example, the ADC 100 converts Vin to a digital representation one bit at a time starting with the most significant bit (bit 11). Then, bit 10 is determined, then bit 9, and so on, through the least significant bit (bit 0). Thus, the first bit determined is bit 11, the second bit determined is bit 10, and so on as indicated in FIG. 2. In an example, upper order bits are determined before the lower order bits are determined. The ADC 100 can be programmed, arranged, or have an architecture to provide any desired number of bits. For example, the ADC 100 may be a 12-bit converter meaning that Vin is converted to a 12-bit digital representation for output. Digital representations other than 12 bits are also possible. For example, a 12-bit ADC is assumed throughout in the present description, however, the present description is in no way limited to only 12-bit ADCs. In some implementations, as shown herein and described below with respect to FIG. 2, the sample and hold circuit 102 and the DAC 108 are implemented in a same circuit.

FIG. 2 is a schematic diagram of a DAC 150, in accordance with various examples. The DAC 150 may encompass functionality of the DAC 108 and sample and hold circuit 102 of FIG. 1. FIG. 2 shows the DAC 150 and the comparator 104 and omits the SAR logic 106 for ease of understanding. However, the SAR logic 106 may be coupled to the DAC 150, such as to switches of the DAC 150, to provide control signals to the DAC 150. As described above, in some examples, the sample and hold functionality of the sample and hold circuit 102 may be inherent in the operation of the DAC 150, and thus the example of FIG. 2 does not include a separate sample and hold circuit, as shown in FIG. 1, apart from the DAC 150.

The DAC 150 of FIG. 2 includes a capacitive network 152 (also referred to as a "CDAC") and a resistive network 160. In some examples, the CDAC 152 includes multiple MSB capacitors 154 and a pair of LSB capacitors 156. The MSB capacitors 154 include two groups of capacitors, each group having some (e.g., half) of the total MSB capacitors 154. A bottom group 154a of the MSB capacitors 154 in FIG. 2 are designated as 1C, 2C, 4C, 8C and 16C ("C" referring to a capacitance value). Thus, the 2C capacitor has twice the capacitance value as the 1C capacitor and one-fourth the capacitance value of the 8C capacitor. Further, the 16C capacitor has 16 times the capacitance of the 1C capacitor. Any of these capacitors may be implemented using groups of capacitors coupled in parallel (e.g., a 16C capacitor may be implemented using a group of four 4C capacitors coupled in parallel). The top group 154b of the MSB capacitors 154 also include 1C, 2C, 4C, 8C and 16C capacitors as shown.

The top group 154b of the MSB capacitors 154 have first terminals that are coupled to ground. In examples, the coupling to ground provides a stable and non-ideality balanced reference voltage for the comparator 104. The top group 154b of the MSB capacitors 154 have second terminals that are coupled together and to the non-inverting input of comparator 104. The bottom group 154a of the MSB capacitors 154 have first terminals that are coupled together and to the inverting input of comparator 104, for example. The bottom group 154a of the MSB capacitors 154 have second terminals coupled to a respective switch. Capacitor 1C in the bottom group 154a couples to a switch 202. Capacitor 2C in the bottom group 154a couples to a switch 204. Capacitor 4C in the bottom group 154a couples to a switch 206. Capacitor 8C in the bottom group 154a couples to a switch 208. Capacitor 16C in the bottom group 154a couples to a switch 210. Each of switches 202-210 is independently and separately controlled by SAR logic 106. For example, each switch 202-210 can be controlled by SAR logic 106 without regard to the states of the other switches. Each switch 202-210 can selectively couple its respective capacitor to one of an input voltage (Vin), Vref1, or Vref2.

The DAC 150 also includes a pair of LSB capacitors 156 including capacitors 156a and 156b. One terminal of each capacitor 156a, 156b couples to an input of comparator 104, as shown in FIG. 2. The other terminal of capacitor 156a couples to switch 212. Switch 212 selectively couples capacitor 156a to either Vin or a tap in the resistive network 160.

The DAC 150 also includes a resistive network 160. The resistive network 160 includes multiple, serially-coupled resistors R coupled between Vref and ground. Preferably, the resistors R all have the same or similar resistance value and thus the voltage across the resistive network 160 preferably is divided evenly among the various resistors R. Any suitable number of resistors R can be provided. In some embodiments, for example, the resistive network 160 includes 128 resistors. The node points ("taps") between pairs of adjacent resistors R can be coupled to the LSB capacitors 156 via switches 216 which are controlled by SAR logic 106. The SAR logic 106 can selectively close one of the switches 216 to couple a selected tap of the resistive network 160 to switch 212 and thus to capacitor 156a. A resistive network 160 having, for example, 128 resistors may have 129 tap points and thus 129 switches in switches 216. The switches 216 can access any voltage from Vref2 to Vref1 and at each node between each adjacent pair of resistors of the resistive network 160. In an example, the resistive network 160 and the LSB capacitors 156 are referred to as a sub-ADC, as described above.

A switch 220 is provided across the inputs of the comparator 104, such as to short the comparator 104 inverting and non-inverting inputs together during sampling. A switch 222 also couples the comparator 104 inputs to ground in this example, though in other examples the switch 222 may couple the comparator 104 inputs to a node that provides a signal having a value other than ground, as determined by an application of the DAC 150.

A capacitor 224 is coupled between a midpoint of the resistive network 160 and ground via a switch 226. In some examples, the capacitor 224 has approximately a same capacitance as the capacitor 156a (e.g., a capacitance of 1C, as described herein). The capacitor 224 is coupled to a top of the resistive network 160 (e.g., to receive Vref1) via a switch 228. The midpoint of the resistive network 160 is a tap at which a voltage is provided that is equal to (Vref1+Vref2)/2. In an example including 128 resistors coupled in series between nodes that provide Vref1 and Vref2, sequentially numbering the nodes of the resistive network 160 starting with 0 as the node that provides Vref1, the node that provides Vref2 will be node 128 of the resistive network 160. The midpoint of the resistive network 160 is, in this example, a tap point provided at node 64 of the resistive network 160 as counted up from zero, based on the indexing provided above and progressing downward through the resistive network 160. In an example, the capacitor 224 and switches 226, 228 are collectively referred to as a charge boost network.

The number of capacitors, switches, and resistors included in the DAC 150 can be varied in other examples to achieve whatever level of digital conversion resolution is desired for a given application.

The ADC 100 may operate with the DAC 150 in single-ended or differential modes of operation. The example of FIG. 2 and generally of this disclosure describes single-ended, single-sided operation of the DAC 150. However, in other examples the teachings of this disclosure are also applicable to single-ended, dual-sided DACs, as well as DACs that also include the differential mode of operation. DAC 150 has built-in sample and hold functionality. During sampling, switch 220, 222, and 228 are closed and switches 202-210, 212 are switched to Vin. During holding, switch 220 and 222 are opened while switches 202-210, and 212 are coupled to a node to receive Vref2, with the lowest most switch (e.g., the switch coupled to Vref2) in switches 216 closed. As a result, a voltage of Vref2−Vin is applied to the inverting input of comparator 104.

The analog-to-digital conversion process is a multi-step process. Upper order bits are determined through operation, by the SAR logic 106, of the switches 202-210 and via the MSB capacitors 154. During a first conversion step, the largest capacitor 16C is coupled via switch 210 to Vref1, which corresponds to a full scale voltage range of ADC 100. Capacitor 16C forms a capacitor divider with the remaining capacitors of the bottom group 154a coupled to Vref2 and whose equivalent capacitance also is 16C (capacitors 8C, 4C, 2C, 1C, and 1C in parallel have an equivalent capacitance of 16C). As such, one half of Vref1 is superimposed on the inverting input of the comparator 104, which already was at a voltage of Vref2−Vin. Thus, the voltage on the inverting terminal of the comparator 104 is Vref2−Vin+(Vref1+Vref2)/2.

In an example, the non-inverting input of the comparator 104 is at ground and the inverting input of the comparator 104 is at approximately Vref2−Vin+(Vref1+Vref2)/2, and an output signal of the comparator 104 indicates whether VIN is greater than (Vref1+Vref2)/2 or lesser than (Vref1+Vref2)/2. The SAR logic 106, or other processing, logic, or storage structure (not shown) may record or otherwise store the output signal of the comparator 104. After storing of the output signal of the comparator 104, the SAR logic 106 proceeds to determining an output signal of the comparator 104 for a next bit in the digital representation for all capacitors of the bottom group 154a to determine the MSBs of the digital representation. During determination of the MSBs of the digital representation, capacitor 156a is coupled through the switch 212 and a lowest switch of the switches 216, to a lowest tap point in the resistive network 160 (e.g., to Vref2).

In some SAR ADC configurations, the first of the lower order bits is determined by switching the voltage on capacitor 156a from Vref2 to the midpoint tap of the resistive network 160 (e.g., to have a voltage of (Vref1−Vref2)/2)+Vref2). The midpoint tap of the resistive network 160 is used to continue the comparison process similar to that described above, with each succeeding iteration using the midpoint tap in the voltage subrange that was determined to contain Vin in the preceding cycle. For example, if Vref1 is 3 volts (V) and Vref2 is 0 V (e.g., such as ground), then the first lower order bit determination, which taps out the midpoint of the resistive network 160 represents a voltage jump of 1.5 V. If VIN is found to be in the upper range of Vref1−Vref2 (e.g., 1.5-3 V), then the next time the capacitor 156a is switched instead of to the midpoint tap of the resistive network 160 to a tap of the resistive network 160 having a value of the 3*3/4 V. If the input was determined to be in the lower range of Vref1−Vref2 (e.g., 0-1.5 V), then the next time the capacitor is switched instead of to the midpoint tap of the resistive network 160 to a tap of the resistive network 160 having a value of the 3*1/4 V. This process continues until all remaining bits of the digital representation are determined.

In the above example, the first voltage jump on the bottom plate of the capacitor 156a is from Vref2 to (Vref2+Vref1)/2, which has a magnitude of (Vref1−Vref2)/2. In a second voltage jump on the bottom plate of the capacitor 156a, the voltage begins at (Vref2+VRef1)/2 and jumps to either=Vref1*3/4+Vref2*1/4 or Vref1*1/4+Vref2*3/4. The second voltage jump has a magnitude of (Vref1−Vref2)/4, or half of the first voltage jump. This continues such that an effective amount of voltage change on the bottom plate of capacitor 156a reduces, in some examples, by a factor of 2. In other SAR ADC implementations the reduction may be by a factor of X, where X is any positive, non-zero value. To facilitate accurate comparison and resulting decision making by the comparator 104, the voltage at the bottom plate of capacitor 156a is allowed to settle to a programmed voltage (e.g., (Vref1−Vref2)/2+Vref2 in first voltage jump) prior to the comparator 104 providing its output signal. Depending on the architecture of the DAC 150 and CDAC 152 configuration, this settling time constraint can be traded off with other parameters. However, reducing the settling time often increases an area, and therefore cost, of a circuit architecture.

In an example, the SAR logic 106 controls the switch 228 to open and the switch 226 to close responsive to the switches 216 opening and the midpoint of the resistive network 160 being coupled to the capacitor 156a via the switch 212. This circuit arrangement forms a capacitor divider between the capacitor 156a and the capacitor 224 such that charge averaging occurs between the capacitor 156a and the capacitor 224. The charge sharing changes a voltage provided at the bottom plate of the capacitor 156a and top plate of the capacitor 224 to be approximately equal to (Vref1−Vref2)/2+Vref2 such that mismatch and parasitic errors remain for compensation or correction by the resistive network 160. This decreases the effective step jump required to be settled and, in turn, the settling time for the voltage at the midpoint of the resistive network 160 for the first voltage jump. Subsequent to determining a first of the lower order bits of the digital representation, the SAR logic 106 controls the switch 226 to open and the switch 228 to close, preventing the capacitor 224 from affecting subsequent operation of the DAC 150.

Once the tap voltages are applied through switches 216 and 212 to the capacitors 156a, the output of comparator 104 indicates whether Vin is greater or smaller than the voltage provided based on the resistive network 160 and CDAC 152 combination. If the comparator 104 output value is high, the current bit is determined to be a 1. If the comparator 104 output value is low, the bit is determined to be a 0.

In some examples, control logic 230 may be coupled to the DAC 150. For example, although these connections are not shown in FIG. 2, the control logic 230 may be coupled to each switch of the DAC 150, such as to control terminals of the switches. The switches may be controlled as described above based on values of control signals received from the control logic 230. In some examples, the control logic 230 is a portion of the SAR logic 106. In other examples, the control logic is separate from the SAR logic 106.

Figure 3:
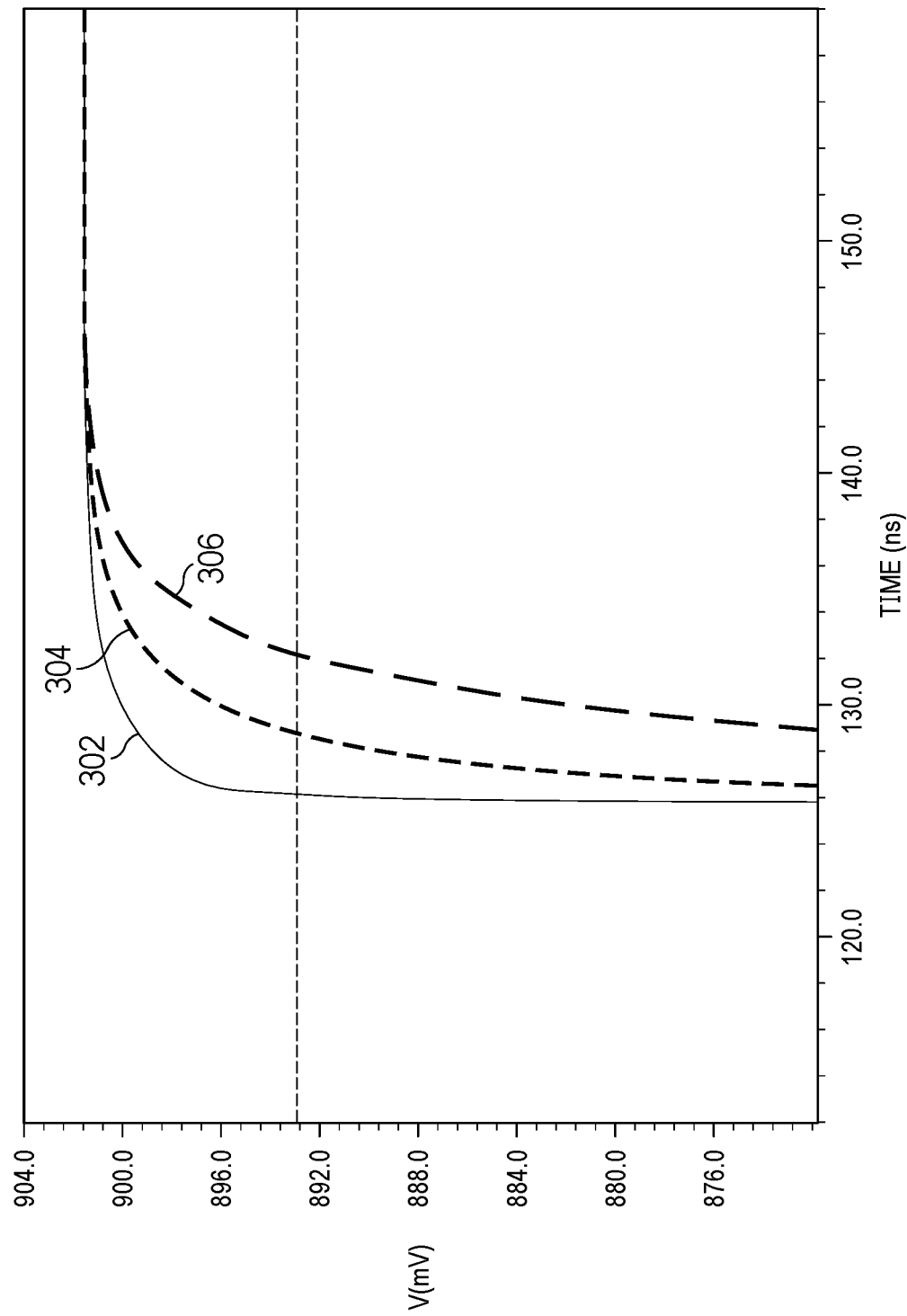
FIG. 3 is a diagram of signal waveforms, in accordance with various examples.

FIG. 3 is a diagram 300 of signal waveforms, in accordance with various examples. In an example, at least some of the waveforms of the diagram 300 are representative of signals that may be provided by a DAC, such as the DAC 150. In the diagram 300 a vertical axis is representative of voltage in units of millivolts (mV) and a horizontal axis is representative of time in units of nanoseconds (ns). The diagram 300 includes waveform 302, waveform 304, and waveform 306. Waveform 302 is representative of an ideal voltage settling behavior at the midpoint of the resistive network 160 DAC 150. Waveform 304 is representative of the voltage at the midpoint of the resistive network 160 during operation of the DAC 150 including use of a charge boost capacitor, as described herein. Waveform 306 is representative of the voltage at the midpoint of the resistive network 160 during operation of the DAC 150 without the use of the charge-boost capacitor described herein (e.g., such that the waveform 306 is representative of performance for a conventional approach).

For the diagram 300, Vref1 is assumed to have a value of 1.8 V and Vref2 has a value of 0 V such that the midpoint of the resistive network 160 settles to a voltage of approximate 0.9 V or 900 mV. As is shown by a comparison of the waveforms 304, 306, the use of a charge boost capacitor, as described herein, reduces settling time of the voltage at the midpoint of the resistive network 160 by greater than 3 ns.

Figure 4:
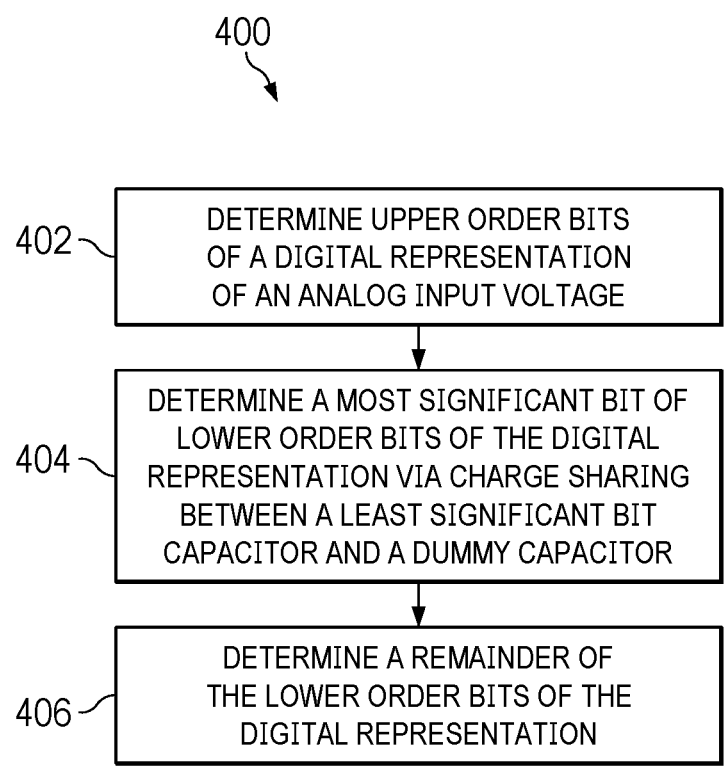
FIG. 4 is a flow diagram of a method, in accordance with various examples.

FIG. 4 is a flow diagram of a method 400 for performing a digital-to-analog conversion, in accordance with various examples. In at least some examples, the method 400 is implemented by a DAC, such as the DAC 150, under control of a controller, such as the SAR logic 106. The method 400 may be implemented to convert an input voltage (e.g., Vin) from an analog representation to a digital representation.

At operation 402, upper order bits of the digital representation are determined. In some examples, the upper order bits are determined via a CDAC, such as the CDAC 152, in a manner substantially as described above with respect to FIG. 2.

At operation 404, a most significant bit of the lower order bits of the digital representation is determined. To determine the most significant bit of the lower order bits of the digital representation, in an example, a charge boost capacitor is coupled to a midpoint of an RDAC of the DAC. The RDAC includes, for example, the resistive network 160. The charge boost capacitor is coupled to the midpoint of the RDAC to implement charge sharing between a capacitor of the RDAC (e.g., a LSB capacitor) and the charge boost capacitor. As described above, a voltage jump, and therefore power consumption and time to settle, is greatest among determinations of the lower order bits for the most significant bit of the lower order bits. By coupling the charge boost capacitor to the midpoint of the resistive network the settling time is reduced, thereby decreasing power consumption and increasing speed of operation. The most significant bit of the lower order bits of the digital representation is determined in a manner substantially as described above with respect to FIG. 2.

At operation 406, a remainder of the lower order bits of the digital representation are determined. In some examples, the lower order bits are determined via a RDAC, such as including the resistive network 160, as described above with respect to FIG. 2. The charge boost capacitor coupled to the midpoint of the RDAC of the DAC at operation 404 may be de-coupled from the midpoint of the RDAC at operation 406, such as to prevent the charge boost capacitor from affecting operation of the DAC in determining the remainder of the lower order bits of the digital representation.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A circuit, comprising:
a set of resistors each having a first terminal and a second terminal, the second terminal of each resistor coupled to the first terminal of a next resistor to form a series coupling of the set of resistors, the set of resistors coupled between a first reference voltage connection terminal and a second reference voltage connection terminal;
a set of switches each having a first terminal and a second terminal, the first terminal of each switch coupled to the second terminal of a respective resistor of the set of resistors, the second terminals of the set of switches coupled with each other to form a joint terminal;
a first set of capacitors associated with a first set of bits of analog-to-digital conversion and including a first capacitor and a second capacitor, the first capacitor and the second capacitor each having a first terminal and a second terminal, the first terminal of the first capacitor coupled to a first input terminal of a comparator, the first terminal of the second capacitor coupled to a second input terminal of the comparator;
a first switch configured to selectively couple the second terminal of the second capacitor to the joint terminal or an input voltage connection terminal;
a second set of capacitors associated with a second set of bits of the analog-to-digital conversion and including a third capacitor and a fourth capacitor, the third capacitor and the fourth capacitor each having a first terminal and a second terminal, the first terminal of the third capacitor coupled to the first input terminal of the comparator, the second terminal of the third capacitor coupled to the second terminal of the first capacitor, the first terminal of the fourth capacitor coupled to the second input terminal of the comparator;
a second switch configured to selectively couple the second terminal of the fourth capacitor to the input voltage connection terminal, the first reference voltage connection terminal, or the second reference voltage connection terminal;
a third switch having a first terminal and a second terminal, the first terminal coupled to the first reference voltage connection terminal;
a fifth capacitor having a first terminal and a second terminal, the first terminal coupled to the second terminal of the third switch; and
a fourth switch having a first terminal and a second terminal, the first terminal coupled constantly to a midpoint of the set of resistors, the second terminal coupled to the second terminal of the third switch.

2. The circuit of claim 1, wherein during a first period of time, the first switch is configured to couple the second terminal of the second capacitor to the input voltage connection terminal, and the second switch is configured to couple the second terminal of the fourth capacitor to the input voltage connection terminal.

3. The circuit of claim 2, wherein during a second period of time after the first period of time, the first switch is configured to couple the second terminal of the second capacitor to the joint terminal, the second switch is configured to couple the second terminal of the fourth capacitor to the second reference voltage connection terminal, and the set of switches is configured to couple the joint terminal to the second terminal of a last resistor of the set of resistors so as to provide a second reference voltage at the joint terminal.

4. The circuit of claim 3, wherein during a third period of time after the second period of time, the second switch is configured to couple the second terminal of the fourth capacitor to the first reference voltage connection terminal.

5. The circuit of claim 4, wherein during a fourth period of time after the third period of time, the set of switches is configured to couple the joint terminal to the midpoint of the set of resistors.

6. The circuit of claim 1, wherein the first capacitor has a capacitance same as the second capacitor.

7. The circuit of claim 6, wherein the third capacitor has a capacitance same as the fourth capacitor.

8. The circuit of claim 7, wherein the first capacitor has a capacitance same as the third capacitor.

9. The circuit of claim 8, wherein:
the second set of capacitors further comprises a sixth capacitor and a seventh capacitor each having a first terminal and a second terminal, the first terminal of the sixth capacitor coupled to the first input terminal of the comparator, the second terminal of the sixth capacitor coupled to the second terminal of the third capacitor, the first terminal of the seventh capacitor coupled to the second input terminal of the comparator; and
the circuit further comprises a fifth switch configured to selectively couple the second terminal of the seventh capacitor to the input voltage connection terminal, the first reference voltage connection terminal, or the second reference voltage connection terminal.

10. The circuit of claim 9, wherein the third capacitor has a capacitance that is half of a capacitance of the sixth capacitor.

11. The circuit of claim 1, further comprising:
a fifth switch having a first terminal and a second terminal, the first terminal coupled to the first input terminal of the comparator, the second terminal coupled to the second input terminal of the comparator.

12. The circuit of claim 11, further comprising:
a sixth switch having a first terminal and a second terminal, the first terminal coupled to the first input terminal or the second input terminal of the comparator, the second terminal coupled to ground.

13. The circuit of claim 1, wherein the first input terminal of the comparator is a non-inverting input terminal of the comparator, and the second input terminal of the comparator is an inverting input terminal of the comparator.

14. The circuit of claim 1, wherein the circuit implements a successive approximation register (SAR) analog-to-digital converter (ADC).

15. A device, comprising:
a set of resistors each having a first terminal and a second terminal, the second terminal of each resistor coupled to the first terminal of a next resistor to form a series coupling of the set of resistors, the set of resistors coupled between a first reference voltage connection terminal and a second reference voltage connection terminal;
a set of switches each having a first terminal and a second terminal, the first terminal of each switch coupled to the second terminal of a respective resistor of the set of resistors, the second terminals of the set of switches coupled with each other to form a joint terminal;

a first set of capacitors associated with a first set of bits of analog-to-digital conversion and including a first capacitor and a second capacitor, the first capacitor and the second capacitor each having a first terminal and a second terminal, the first terminal of the first capacitor coupled to a first input terminal of a comparator, the first terminal of the second capacitor coupled to a second input terminal of the comparator;

a first switch;

a second set of capacitors associated with a second set of bits of the analog-to-digital conversion and including a third capacitor and a fourth capacitor, the third capacitor and the fourth capacitor each having a first terminal and a second terminal, the first terminal of the third capacitor coupled to the first input terminal of the comparator, the second terminal of the third capacitor coupled to the second terminal of the first capacitor, the first terminal of the fourth capacitor coupled to the second input terminal of the comparator;

a second switch;

a third switch;

a fourth switch coupled constantly to a midpoint of the set of resistors;

a fifth capacitor; and a control circuit configured to:
control the first switch to selectively couple the second terminal of the second capacitor to the joint terminal or an input voltage connection terminal;
control the second switch to selectively couple the second terminal of the fourth capacitor to the input voltage connection terminal, the first reference voltage connection terminal, or the second reference voltage connection terminal;
control the third switch to selectively couple the fifth capacitor to the first reference voltage connection terminal; and
control the fourth switch to selectively couple the fifth capacitor to the midpoint of the set of resistors.

16. The device of claim 15, wherein:
the second set of capacitors further comprises a sixth capacitor and a seventh capacitor each having a first terminal and a second terminal, the first terminal of the sixth capacitor coupled to the first input terminal of the comparator, the second terminal of the sixth capacitor coupled to the second terminal of the first capacitor, the first terminal of the seventh capacitor coupled to the second input terminal of the comparator; and
the device further comprises a fifth switch configured to selectively couple the second terminal of the seventh capacitor to the input voltage connection terminal, the first reference voltage connection terminal, or the second reference voltage connection terminal,
wherein the first capacitor, the second capacitor, the third capacitor, and the fourth capacitor have a first capacitance, the sixth capacitor and the seventh capacitor have a second capacitance, and the first capacitance is half of the second capacitance.

17. The device of claim 15, wherein during a first period of time, the control circuit is configured to control the first switch to couple the second terminal of the second capacitor to the input voltage connection terminal, and the second switch to couple the second terminal of the fourth capacitor to the input voltage connection terminal.

18. The device of claim 17, wherein during a second period of time after the first period of time, the control circuit is configured to control the first switch to couple the second terminal of the second capacitor to the joint terminal, the second switch to couple the second terminal of the fourth capacitor to the second reference voltage connection terminal, and the set of switches to couple the joint terminal to the second terminal of a last resistor of the set of resistors so as to provide a second reference voltage at the joint terminal.

19. The device of claim 18, wherein during a third period of time after the second period of time, the control circuit is configured to control the second switch to couple the second terminal of the fourth capacitor to the first reference voltage connection terminal.

20. The device of claim 19, wherein during a fourth period of time after the third period of time, the control circuit is configured to control the set of switches to couple the joint terminal to the midpoint of the set of resistors.

* * * * *